(12) United States Patent
Hu

(10) Patent No.: US 10,003,890 B2
(45) Date of Patent: Jun. 19, 2018

(54) MEMS MICROPHONE

(71) Applicant: CSMC TECHNOLOGIES FAB1 CO., LTD., Jiangsu (CN)

(72) Inventor: Yonggang Hu, Jiangsu (CN)

(73) Assignee: CSMC TECHNOLOGIES FAB1 CO., LTD., Jiangsu (CN)

( * ) Notice: Subject to any disclaimer, the term of this patent is extended or adjusted under 35 U.S.C. 154(b) by 0 days. days.

(21) Appl. No.: 15/119,878

(22) PCT Filed: Jun. 25, 2015

(86) PCT No.: PCT/CN2015/082285
§ 371 (c)(1),
(2) Date: Aug. 18, 2016

(87) PCT Pub. No.: WO2016/015530
PCT Pub. Date: Feb. 4, 2016

(65) Prior Publication Data
US 2017/0070824 A1    Mar. 9, 2017

(30) Foreign Application Priority Data

Aug. 1, 2014  (CN) .......................... 2014 1 0376030

(51) Int. Cl.
*H04R 19/04* (2006.01)
*H04R 7/14* (2006.01)
(Continued)

(52) U.S. Cl.
CPC .......... *H04R 19/04* (2013.01); *B81B 3/0037* (2013.01); *H04R 7/12* (2013.01); *H04R 7/14* (2013.01);
(Continued)

(58) Field of Classification Search
CPC . H04R 19/04; H04R 7/02; H04R 7/04; H04R 7/12; H04R 7/122; H04R 7/127;
(Continued)

(56) References Cited

U.S. PATENT DOCUMENTS

| 2006/0233401 A1 | 10/2006 | Wang |
| 2009/0309173 A1 | 12/2009 | Nakatani et al. |

(Continued)

FOREIGN PATENT DOCUMENTS

| CN | 101841758 | 9/2010 |
| CN | 102264021 | 11/2011 |

(Continued)

OTHER PUBLICATIONS

International Search Report for PCT/CN2015/082285, dated Sep. 14, 2015, 6 pages including English translation.

(Continued)

*Primary Examiner* — Joshua Kaufman
(74) *Attorney, Agent, or Firm* — Hamre, Schumann, Mueller & Larson, P.C.

(57) ABSTRACT

A MEMS microphone includes a substrate (100), a supporting part (200), an upper polar plate (300) and a lower polar plate (400). The substrate (100) is provided with an opening (120) penetrating the middle thereof; the lower polar plate (400) straddles the opening (120); the supporting part (200) is fixed on the lower polar plate (400); the upper polar plate (300) is affixed to the supporting part (200); an accommodating cavity (500) is formed among the supporting part (200), the upper polar plate (300) and the lower polar plate (400); a recess (600) opposite to the accommodating cavity (500) is arranged in an intermediate region of at least one of the upper polar plate (300) and the lower polar plate (400), and insulation is achieved between the upper polar plate (300) and a lower polar plate (400).

14 Claims, 4 Drawing Sheets

(51) Int. Cl.
  *H04R 7/12* (2006.01)
  *B81B 3/00* (2006.01)
  *H04R 7/16* (2006.01)

(52) U.S. Cl.
  CPC ........ *H04R 7/16* (2013.01); *B81B 2201/0257* (2013.01); *B81B 2203/0127* (2013.01); *B81B 2203/0315* (2013.01); *H04R 2201/003* (2013.01)

(58) Field of Classification Search
  CPC H04R 7/14; H04R 2201/003; H04R 2207/00; H04R 2207/021; B81B 3/0037; B81B 2201/003; B81B 2201/0257; B81B 2203/0127; B81B 2203/0315
  See application file for complete search history.

(56) References Cited

U.S. PATENT DOCUMENTS

| | | | |
|---|---|---|---|
| 2012/0319219 A1* | 12/2012 | Diamond | H04R 19/005 257/416 |
| 2012/0328132 A1 | 12/2012 | Wang | |
| 2013/0221453 A1* | 8/2013 | Dehe | H04R 19/005 257/415 |
| 2013/0264663 A1 | 10/2013 | Dehe et al. | |
| 2015/0014797 A1* | 1/2015 | Schelling | B81B 3/0059 257/416 |

FOREIGN PATENT DOCUMENTS

| | | |
|---|---|---|
| CN | 102740204 A | 10/2012 |
| CN | 103121657 A | 5/2013 |
| CN | 103281659 | 9/2013 |
| CN | 203446028 | 2/2014 |
| EP | 1100289 | 5/2001 |
| EP | 1640329 A2 | 3/2006 |
| EP | 2565153 | 3/2013 |

OTHER PUBLICATIONS

Chinese Office Action, Chinese Patent Application No. 201410376030.2, dated Nov. 24, 2017 (9 pages).

Extended European Search Report for European appl. No. 15827631.1, dated Feb. 13, 2018 (7 pages).

* cited by examiner

MEMS MICROPHONE

FIELD OF THE INVENTION

The present invention relates to a technical field of semiconductor devices, and more particular relates to a MEMS microphone.

BACKGROUND OF THE INVENTION

The research of MEMS microphone chip has been continued for about 20 years, during this time, various microphone chips have been developed, such as piezo-resistive chip, piezo-electric chip, and capacitive microphones chip, in which the application of the capacitive MEMS microphone is most extensively. The capacitive MEMS microphone possesses advantages as follows: such as a mall volume, a high sensitivity, a better frequency characteristic, and a low noise. In addition, the capacitive MEMS microphone has a wide working temperature, it can work under a poor environment. The capacitive microphone can be distinguished into a double diaphragm capacitive structure and a signal diaphragm capacitive structure, and most of the capacitive microphones in which adopts the double diaphragm capacitive structure.

The capacitive silica-based MEMS microphone is generally consisted of a backplate and a vibrating diaphragm. The vibrating diaphragm has certain flexibility and it can be vibrated by virtue of air. The backplate has certain rigidity and fully defines a plurality of holes which are so called acoustic holes. Air can penetrate through the plurality of holes to enable the vibrating diaphragm to vibrate, and the backplate will not vibrate accompanying to the vibrating diaphragm. A plate capacitor is constituted by the backplate and the vibrating diaphragm, a voice drives the flexible vibrating diaphragm to vibrate by the air, thereby changing the capacitance value of the plate capacitor. The change of the capacitance value generates an electrical signal which can be detected by an external circuit, thereby a transition from a voice signal to an electrical signal can be achieved. The MEMS device, including silica-based microphone, is generally produced by an integrated circuit manufacturing technology. The silica-based microphone has a wide application prospect in the fields such as hearing-aid and mobile communication equipment.

For the capacitance silica-based MEMS microphone, the flexibility of the vibrating diaphragm determines a sensitivity of the microphone, because a greater flexibility results to a greater longitudinal displacement of the vibrating diaphragm, and a greater electrical signal is generated. However, the softer of the vibrating diaphragm, the easier it is adhered to the backplate, causing the MEMS microphone not to work correctly, and a yield is severely affected. There are various methods to avoid the adhesion between the backplate and the vibrating diaphragm, at present, a more efficient method is to produce anti-adhesion bulges, however, the process steps are increased, and a cost is increased. Another method is to excavate a central region of the backplate. Because a central region of the vibrating diaphragm has a highest mechanical sensitivity and a greatest deformation, it can be easily adhered to the backplate. When the central region of the backplate is excavated, the adhesion between the vibrating diaphragm and the backplate can be efficiently avoided. However, the central region of the vibrating diaphragm has the highest mechanical sensitivity, and the edges have a lower mechanical sensitivity, when the central region of the backplate is excavated, the central position of the vibrating diaphragm is wasted, reducing a sensitivity of the MEMS microphone

SUMMARY OF THE INVENTION

Accordingly, it is necessary to provide a MEMS microphone which can effectively reduce a probability of an adhesion generated between a vibrating diaphragm and a backplate, and improve a yield.

A MEMS microphone includes: a substrate defining an opening extending through a middle portion thereof; a lower polar plate straddling on the opening; a supporting portion fixed to the lower polar plate; and an upper polar plate laminated to the supporting portion; wherein the supporting portion, the upper polar plate, and the lower polar plate cooperatively form an accommodating cavity, a central region of the upper polar plate and/or the lower polar plate is provided with a recess corresponding to the accommodating cavity, the upper polar plate is insulated from the lower polar plate.

In the above MEMS microphone, because the central region of the upper polar plate or the central region of the lower polar plate is provided with a recess, a distance between the central region of upper polar plate and the central region of the lower polar plate is relatively far, the upper polar plate (for example serving as the vibrating diaphragm) and the lower polar plate (for example serving as the backplate) which form a variable capacitance structure are difficult to be adhered to each other, thus effectively reducing a probability of an adhesion generated between the vibrating diaphragm and the backplate, and improving a yield. At the same time, because it is not necessary to remove the central region of the polar plate of the variable capacitance, it effectively takes advantage of the region of the vibrating diaphragm having a highest mechanical sensitivity, and the sensitivity of the MEMS microphone is maintained to the maximum extent.

BRIEF DESCRIPTION OF THE DRAWINGS

In order to illustrate the technical solution of the invention or prior art more clearly, hereinafter, a brief introduction of accompanying drawings employed in the description of the embodiments or the prior art is provided. It is apparent that accompanying drawings described hereinafter merely are several embodiments of the invention. For one skilled in the art, other drawings can be obtained according to the accompanying drawings, without a creative work.

DETAILED DESCRIPTION OF THE EMBODIMENTS

Figure 1:
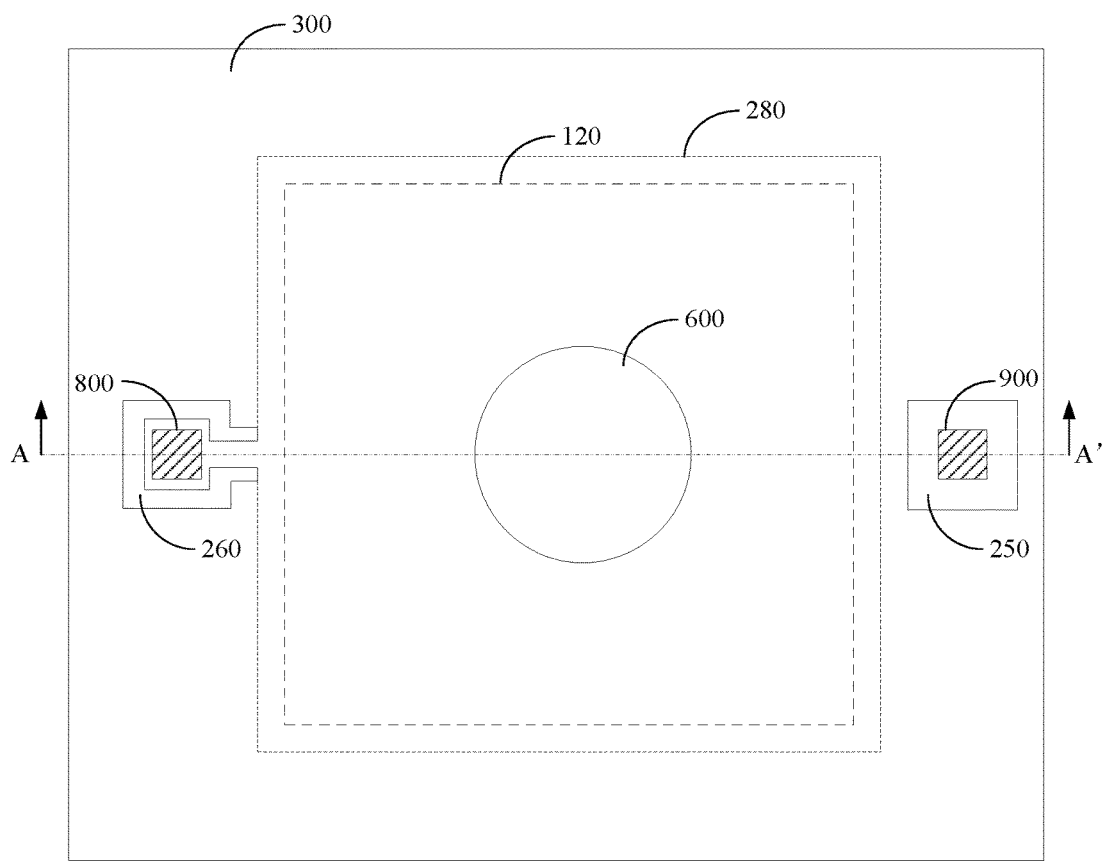
FIG. 1 is a top view of a MEMS microphone according to an embodiment.

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art. Elements that are identified using the same or similar reference characters refer to the same or similar elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The embodiment of the invention will be specifically illustrated with reference to the following description.

Figure 2:
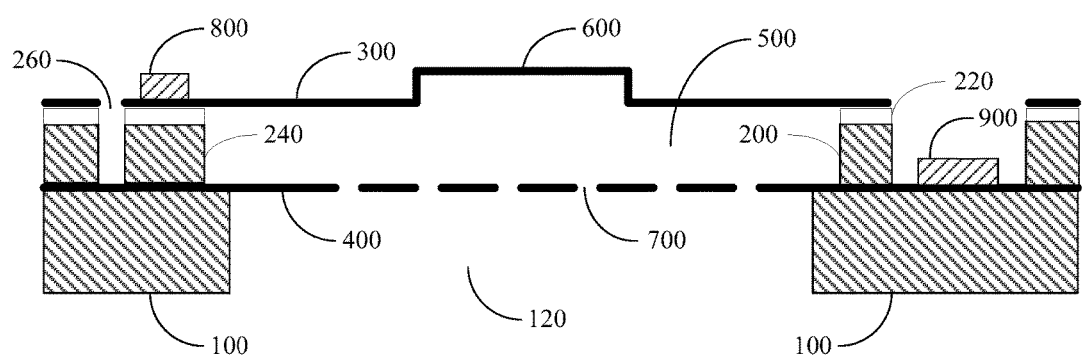
FIG. 2 is a side cross-sectional view taken along line A-A' of FIG. 1.

FIG. 1 is a top view of a MEMS microphone according to an embodiment. FIG. 2 is referred.

A MEMS microphone includes a substrate 100, a supporting portion 200, an upper polar plate 300, and a lower polar plate 400. The substrate 100 defines an opening 120 extending through a middle thereof, the lower polar plate 400 straddles the opening 120. The supporting portion 200 is fixed to the lower polar plate 400, the upper polar plate 300 is laminated to the supporting portion 200. The supporting portion 200, the upper polar plate 300 and the lower polar plate 400 cooperatively form an accommodating cavity 500. A central region of at least one of the upper polar plate 300 and the lower polar plate 400 is provided with a recess 600 corresponding to the accommodating cavity 500. The upper polar plate 300 is insulated from a lower polar plate 400.

In the above MEMS microphone, because the central region of the upper polar plate 300 or the central region of the lower polar plate 400 is provided with a recess, a distance between the central region of upper polar plate 300 and the central region of the lower polar plate 400 is relatively far, the upper polar plate 300 (for example serving as the vibrating diaphragm) and the lower polar plate 400 (for example serving as the backplate) which form a variable capacitance structure are difficult to be adhered to each other, thus effectively reducing a probability of an adhesion generated between the vibrating diaphragm and the backplate, and improving a yield. At the same time, because it is not necessary to remove the central regions of the upper/lower polar plate of the variable capacitance, it effectively takes advantage of the region of the vibrating diaphragm having a highest mechanical sensitivity, and the sensitivity of the MEMS microphone is maintained to the maximum extent.

The embodiment is specifically illustrated with reference to the following description.

Figure 3:
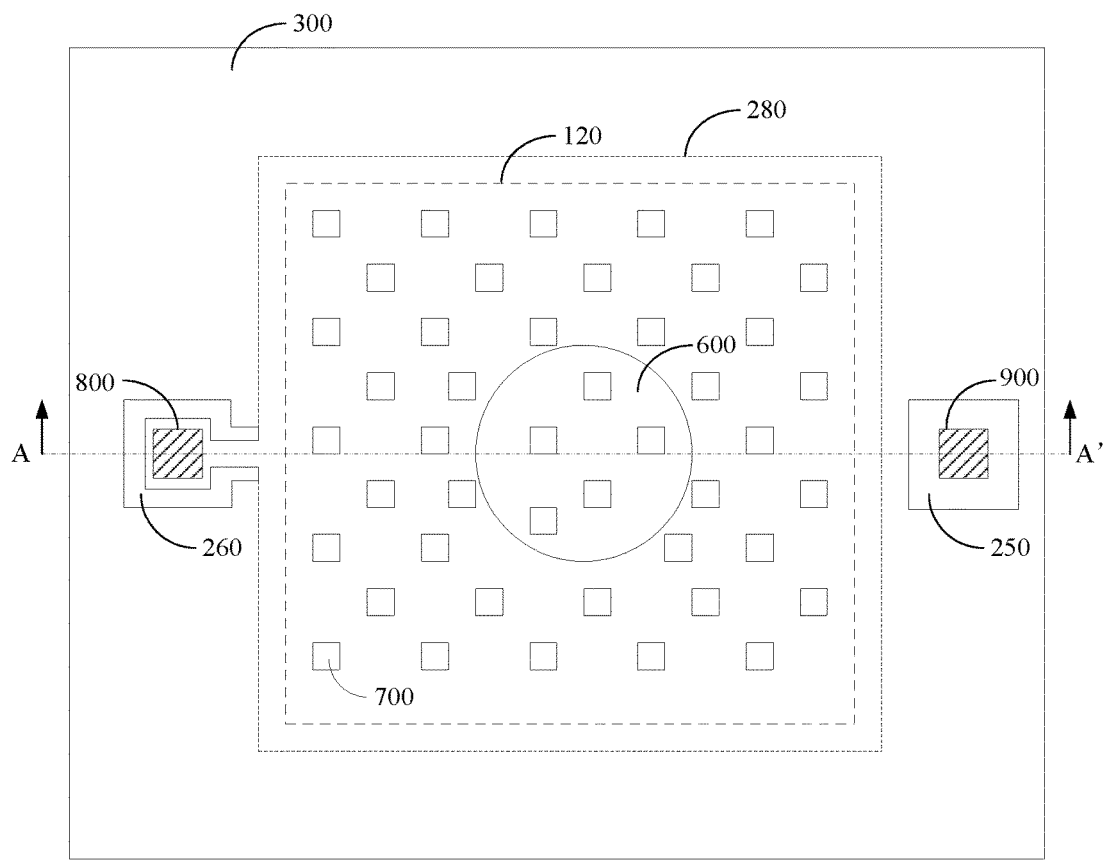
FIG. 3 is a top view of a MEMS microphone according to another embodiment.
Figure 4:
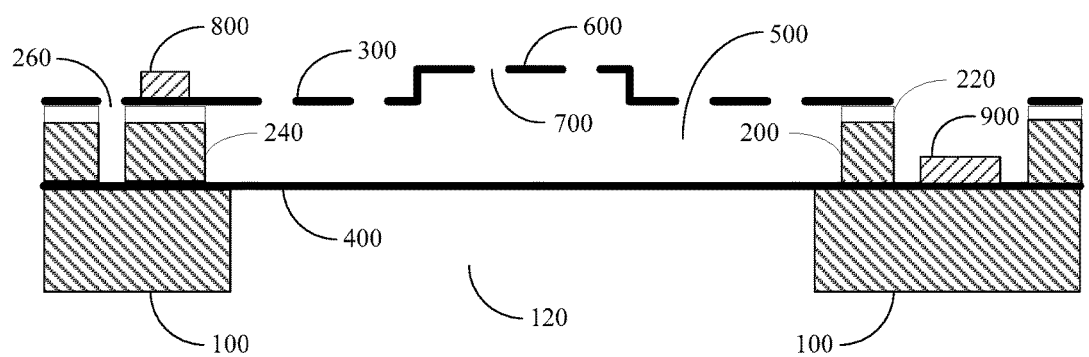
FIG. 4 is a side cross-sectional view taken along line A-A' of FIG. 3.

FIG. 3 is a top view of MEMS microphone according to another embodiment, FIG. 4 is a side cross-sectional view taken along line A-A' of FIG. 3. In the embodiment shown in FIG. 1 and FIG. 3, the central region of the upper polar plate 300 is provided with a recess 600 corresponding to the accommodating cavity 500, and the lower polar plate 400 does not have a recess. In alternative embodiment, the central region of the lower polar plate 400 may be provided with a recess corresponding to the accommodating cavity 500, and the upper polar plate 300 does not have a recess, or both the central regions of the upper polar plate 300 and the lower polar plate 400 are provided with a recess corresponding to the accommodating cavity 500. When both the central regions of the upper polar plate 300 and the lower polar plate 400 are provided with a recess, it can relatively effectively reduce a probability of an adhesion generated between the vibrating diaphragm and the backplate, and improving a yield.

In the embodiment, the material of the substrate 100 is silicon, the material can also be other semiconductor or compound of semiconductors, for example, the substrate 100 is made of one selected from the group consisting of Ge, SiGe, SiC, $SiO_2$ and $Si_3N_4$. The substrate 100 can also be provided with a second insulating layer, the lower polar plate 400 straddles the second insulating layer, the second insulating layer has a function to insulate the substrate 100 from the lower polar plate 400.

As shown in FIG. 1 and FIG. 2, when the upper polar plate 300 serves as a vibrating diaphragm and the lower polar plate 400 serves as a backplate, the upper polar plate 300 is a flexible diaphragm, the lower polar plate 400 is a rigid diaphragm. As shown in FIG. 3 and FIG. 4, when the upper polar plate 300 serves as a backplate and the lower polar plate 400 serves as a vibrating diaphragm, the upper polar plate 300 is a rigid diaphragm, the lower polar plate 400 is a flexible diaphragm. The rigid diaphragm is difficult to be deformed when subjected to an acoustic wave, the flexible diaphragm is easy to be deformed when subjected to the acoustic wave. The upper polar plate 300 or the lower polar plate 400 which serves as the vibrating diaphragm is provided with a plurality of uniformly distributed acoustic holes 700. Certainly, the acoustic holes 700 can also be distributed non-uniformly, for example, the acoustic holes 700 are more concentrative on the central region of the upper polar plate 300 or the central region of the lower polar plate 400. The flexible diaphragm is made of one selected from the group consisting of Si, Ge, SiGe, SiC, or Al, W, Ti, or nitrides of Al, W, Ti. The upper polar plate 300 and the lower polar plate 400 include a conductive layer. The upper polar plate 300 or the lower polar plate 400 can be a wholly conductive structure, and can also be a composite layer structure including a conductive layer.

The supporting portion 200, the upper polar plate 300 and the lower polar plate 400 cooperatively form the accommodating cavity 500, which is actually formed by discharging a sacrificial layer. In the discharging process, the sacrificial layer is etched to form the accommodating cavity. In the embodiment, the shape of the recess 600 is circular. In the other embodiment, it can also be a polygon, such as a square, a regular hexagon, and a regular octagon and so on.

The supporting portion 200 includes a first insulating layer 220, the presence of the first insulating layer 220 enables the upper polar plate 300 to be insulated from the lower polar plate 400. The supporting portion 200 can be entirely made of insulation material, and can also be a composite layer structure including an insulation layer. In the embodiment, the supporting portion 200 has a square frame structure and defines an opening 280 extending through a center thereof. The opening 280 of the supporting portion 200 is a slightly bigger than the opening 120 of the substrate 100, as shown in FIG. 1 and FIG. 3. The supporting portion 200 includes a supporting post 240, which is independent from the square frame structural main body of the supporting portion 200. A gap 260 is formed between the supporting post 240 and the square frame structural main body. The supporting post 240 is mainly employed to amount an upper electrode 800, the function of the gap 260 is employed to space the electrode 800 from the square frame structural main body of the supporting portion 200, thereby enabling the electrode 800 to space from the upper polar plate 300 with a relative larger area on the square frame structural main body of the supporting portion 200, reducing an influence of a parasitic capacitance. The supporting portion 200 further defines an aperture 250, which is employed expose the lower polar plate 400 for fabricating a lower electrode 900. In the embodiment, the aperture 250 has a through hole structure. In other embodiment, the aperture 250 can also be an aperture on the supporting portion 200.

In other embodiments, the supporting portion 200 may be in other polygon frame structures, such as a regular hexagon frame structure, a regular octagon frame structure, or an annular structure.

The MEMS microphone includes an upper electrode 800 and a lower electrode 900. The upper electrode 800 and the lower electrode 900 are made of one selected from the group consisting of the P-type silicon and the N-type silicon. The upper electrode 800 is positioned on the upper polar plate 300 on the supporting post 240 and is electrically coupled to the upper polar plate 300. The lower electrode 900 is positioned in the aperture 250 of the supporting portion 200 and is electrically coupled to the lower polar plate 400.

At last, it should be noted that, the substrate 100 represents a supporting structure for providing a support, and the substrate 100 is not necessary to represent one separate component. The substrate 100 can represent a multilayer structure, its multilayer structure can be formed by technologies such as epitaxy, deposition and boding. It can be understood that drawing of FIG. 1 through FIG. 4 simply exemplify some main structures of the device, and does not represent all of the structures of the device.

The above are several embodiments of the present invention described in detail, and should not be deemed as limitations to the scope of the present invention. It should be noted that variations and improvements will become apparent to those skilled in the art to which the present invention pertains without departing from its spirit and scope. Therefore, the scope of the present invention is defined by the appended claims.

What is claimed is:

1. A MEMS microphone, comprising:
   a substrate defining an opening extending through a middle portion thereof;
   a lower polar plate straddling on the opening;
   a supporting portion fixed to the lower polar plate; and
   an upper polar plate laminated to the supporting portion, wherein the supporting portion, the upper polar plate, and the lower polar plate cooperatively form an accommodating cavity;
   a central region of the upper polar plate is provided with a recess corresponding to the accommodating cavity;
   the upper polar plate is insulated from the lower polar plate; and
   the supporting portion comprises one supporting post independent from a main body of the supporting portion, the supporting post is configured to support an upper electrode, the upper electrode is positioned on the upper polar plate, and the supporting post is aligned with the upper electrode as viewed in a direction perpendicular to a thickness direction of the substrate.

2. The MEMS microphone according to claim 1, wherein the upper polar plate is a flexible diaphragm, the lower polar plate is a rigid diaphragm.

3. The MEMS microphone according to claim 1, wherein the upper polar plate is a rigid diaphragm, the lower polar plate is a flexible diaphragm.

4. The MEMS microphone according to claim 1, wherein the upper polar plate or the lower polar plate defines a plurality of acoustic holes.

5. The MEMS microphone according to claim 1, wherein a shape of the recess is selected from one of circular and polygon.

6. The MEMS microphone according to claim 1, wherein the upper polar plate and the lower polar plate comprise a conductive layer.

7. The MEMS microphone according to claim 1, wherein the substrate is made of one selected from the group consisting of Ge, SiGe, SiC, $SiO_2$, and $Si_3N_4$.

8. The MEMS microphone according to claim 1, wherein the supporting portion contains a first insulating layer configured to insulate the upper polar plate from the lower polar plate.

9. The MEMS microphone according to claim 1, wherein the supporting portion comprises one of annular structure and polygon frame structure.

10. The MEMS microphone according to claim 1, further comprising an upper electrode and a lower electrode, wherein the upper electrode and the lower electrode are made of one selected from the group consisting of P-type silicon and N-type silicon, the upper electrode is electrically coupled to the upper polar plate, the lower electrode is electrically coupled to the lower polar plate.

11. The MEMS microphone according to claim 1, wherein a central region of the lower polar plate is provided with a recess corresponding to the accommodating cavity.

12. The MEMS microphone according to claim 1, wherein a gap is formed between the supporting post and the main body of the supporting portion to space the upper electrode from the main body of the supporting portion.

13. The MEMS microphone according to claim 1, wherein the supporting portion defines an aperture to expose the lower polar plate for fabricating a lower electrode, and the lower electrode is positioned in the aperture of the supporting portion.

14. The MEMS microphone according to claim 1, wherein the supporting portion has a square frame structure.

* * * * *